US012100758B2

(12) United States Patent
Chang et al.

(10) Patent No.: US 12,100,758 B2
(45) Date of Patent: Sep. 24, 2024

(54) HIGH ELECTRON MOBILITY TRANSISTOR AND METHOD OF FABRICATING THE SAME

(71) Applicant: UNITED MICROELECTRONICS CORP., Hsin-Chu (TW)

(72) Inventors: Chun-Ming Chang, Kaohsiung (TW); Chih-Tung Yeh, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/370,875

(22) Filed: Sep. 20, 2023

(65) Prior Publication Data

US 2024/0014309 A1 Jan. 11, 2024

Related U.S. Application Data

(63) Continuation of application No. 17/362,956, filed on Jun. 29, 2021, now Pat. No. 11,830,941, which is a
(Continued)

(30) Foreign Application Priority Data

Jul. 19, 2019 (CN) .......................... 201910653678.2

(51) Int. Cl.
*H01L 29/778* (2006.01)
*H01L 29/66* (2006.01)

(52) U.S. Cl.
CPC .... *H01L 29/7786* (2013.01); *H01L 29/66462* (2013.01)

(58) Field of Classification Search
None
See application file for complete search history.

(56) References Cited

U.S. PATENT DOCUMENTS 8,148,752 B2    4/2012  Ikoshi
9,484,342 B2   11/2016  Handa
(Continued)

FOREIGN PATENT DOCUMENTS

CN        101414629 A     4/2009
JP       2011-119366 A    6/2011
TW          I528549       4/2016

OTHER PUBLICATIONS

N. Pala et al., "Drain-to-gate field engineering for improved frequency response of GaN-based HEMTs", Solid-State Electronics, 2008, pp. 1217-1220, vol. 52, No. 8, Elsevier Ltd., XP023612453.

*Primary Examiner* — Robert K Carpenter
(74) *Attorney, Agent, or Firm* — Winston Hsu

(57) ABSTRACT

A high electron mobility transistor includes a first III-V compound layer. A second III-V compound layer is disposed on the first III-V compound layer, wherein the composition of the first III-V compound layer and the second III-V compound layer are different from each other. A source electrode and a drain electrode are disposed on the second III-V compound layer. A gate electrode is disposed on the second III-V compound layer between the source electrode and the drain electrode. An insulating layer is disposed between the drain electrode and the gate electrode and covering the second III-V compound layer. Numerous electrodes are disposed on the insulating layer and contact the insulating layer, wherein the electrodes are positioned between the gate electrode and the drain electrode and a distribution of the electrodes decreases along a direction toward the gate electrode.

19 Claims, 16 Drawing Sheets

Related U.S. Application Data continuation of application No. 16/535,052, filed on Aug. 7, 2019, now Pat. No. 11,081,579.

(56) References Cited

U.S. PATENT DOCUMENTS

| | | |
|---|---|---|
| 11,081,579 B2 | 8/2021 | Chang |
| 11,830,941 B2 * | 11/2023 | Chang ................ H01L 29/7786 |
| 2013/0127521 A1 | 5/2013 | Simin |
| 2013/0200940 A1 | 8/2013 | Honda |
| 2014/0151747 A1 | 6/2014 | Jeon |
| 2018/0097081 A1 | 4/2018 | Cao |
| 2019/0189762 A1 | 6/2019 | Chu |

\* cited by examiner

HIGH ELECTRON MOBILITY TRANSISTOR AND METHOD OF FABRICATING THE SAME

CROSS REFERENCE TO RELATED APPLICATIONS

This application is a continuation application of U.S. application Ser. No. 17/362,956, filed on Jun. 29, 2021, which is a continuation application of U.S. application Ser. No. 16/535,052, filed on Aug. 7, 2019. The contents of these applications are incorporated herein by reference.

BACKGROUND OF THE INVENTION

1. Field of the Invention

The present invention relates to a high electron mobility transistor (HEMT), and more particularly to an HEMT with low current collapse.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in high power and high frequency products because of their properties of wider bandgap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

Because lattice defects occur during the formation of the III-V semiconductor compounds, electrons are often trapped in these lattice defects during a device operation. These trapped electrons cause current collapse and influence the reliability of the device.

SUMMARY OF THE INVENTION

In light of the above, the present invention provides an electrode on an insulating layer; by applying a voltage to the insulating layer, the trapped electrons can be removed.

According to a preferred embodiment of the present invention, a high electron mobility transistor (HEMT) includes a first III-V compound layer. A second III-V compound layer is disposed on the first III-V compound layer, wherein the composition of the first III-V compound layer and the second III-V compound layer are different from each other. A source electrode and a drain electrode are disposed on the second III-V compound layer. A gate electrode is disposed on the second III-V compound layer between the source electrode and the drain electrode. An insulating layer is disposed between the drain electrode and the gate electrode and covering the second III-V compound layer. Numerous electrodes are disposed on the insulating layer and contact the insulating layer, wherein the electrodes are positioned between the gate electrode and the drain electrode and a distribution of the electrodes decreases along a direction toward the gate electrode.

According to another preferred embodiment of the present invention, a high electron mobility transistor (HEMT) includes a first III-V compound layer. A second III-V compound layer is disposed on the first III-V compound layer, wherein the composition of the first III-V compound layer and the second III-V compound layer are different from each other. A source electrode and a drain electrode are disposed on the second III-V compound layer. A gate electrode is disposed on the second III-V compound layer between the source electrode and the drain electrode. An insulating layer is disposed between the drain electrode and the gate electrode and covering the second III-V compound layer. Numerous electrodes are disposed on the insulating layer and contact the insulating layer, wherein the electrodes are positioned between the gate electrode and the drain electrode and a distribution of the electrodes increases along a direction toward the gate electrode.

According to yet another preferred embodiment of the present invention, a high electron mobility transistor (HEMT) includes a first III-V compound layer. A second III-V compound layer is disposed on the first III-V compound layer, wherein the composition of the first III-V compound layer and the second III-V compound layer are different from each other. A source electrode and a drain electrode are disposed on the second III-V compound layer. A gate electrode is disposed on the second III-V compound layer between the source electrode and the drain electrode. An insulating layer is disposed between the drain electrode and the gate electrode and covers the second III-V compound layer. At least one electrode is disposed on the insulating layer and contacts the insulating layer, wherein the drain electrode electrically connects to the electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 to FIG. 13 depict a method of fabricating an HEMT according to a fourth preferred embodiment of the present invention, wherein:

FIG. 8 depicts a first III-V compound layer and a second III-V compound layer;

FIG. 9 depicts a stage following FIG. 8;

FIG. 10 depicts a stage following FIG. 9;

FIG. 11 depicts a stage following FIG. 10;

FIG. 12 depicts a stage following FIG. 11; and

FIG. 13 depicts a stage following FIG. 12.

DETAILED DESCRIPTION

Figure 1:
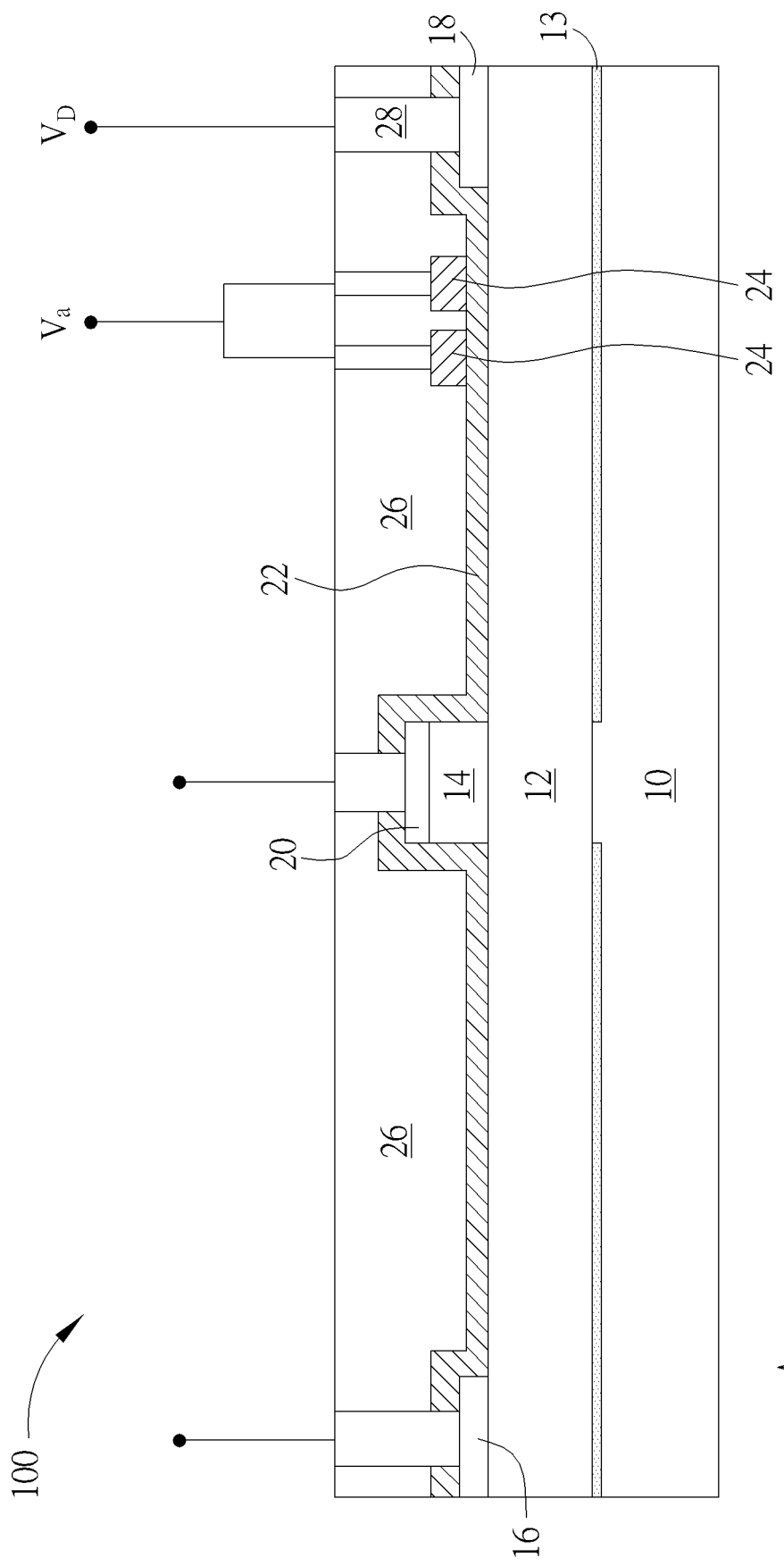
FIG. 1 depicts a high electron mobility transistor (HEMT) according to a first preferred embodiment of the present invention.

FIG. 1 depicts a high electron mobility transistor (HEMT) according to a first preferred embodiment of the present invention. As shown in FIG. 1, an HEMT 100 includes a first III-V compound layer 10 and a second III-V compound layer 12. The second III-V compound layer 12 is disposed on the first III-V compound layer 10. The composition of the first III-V compound layer 10 and the second III-V compound layer 12 are different from each other. For example, the first III-V compound layer 10 may be gallium nitride (GaN) and/or indium gallium nitride ($In_xGa_{1-x}N$) or other materials, while the second III-V compound layer 12 may be aluminum gallium nitride ($Al_xGa_{1-x}N$) and/or aluminum indium nitride ($Al_xIn_{1-x}N$), aluminum indium gallium nitride ($Al_{1-x-y}In_xGa_yN$) aluminum nitride (AlN) or other materials. According to a preferred embodiment of the present invention, the first III-V compound layer 10 is gallium nitride. The second III-V compound layer 12 is aluminum gallium nitride. A two-dimensional electron gas (2DEG) 13 is generated in the second III-V compound layer 12.

A third III-V compound layer 14 is disposed on the second III-V compound layer 12. The third III-V compound layer 14 includes the same material as the first III-V compound layer 10 and P-type dopants. For example, the third III-V compound layer 14 may be P-type gallium nitride and/or P-type indium gallium nitride. Furthermore, the third III-V compound layer 14 can also include the same material as the second III-V compound layer 12 and P-type dopants. For example, the third III-V compound layer 14 can be P-type aluminum gallium nitride, P-type aluminum indium nitride, P-type aluminum indium gallium nitride or P-type aluminum nitride. The P-type dopants can be magnesium (Mg). According to a preferred embodiment of the present invention, the third III-V compound layer 14 is P-type gallium nitride. A source electrode 16 and a drain electrode 18 are disposed on the second III-V compound layer 12. A gate electrode 20 is disposed on the second III-V compound layer 12 between the source electrode 16 and the drain electrode 18. In detail, the gate electrode 20 is disposed on the third III-V compound layer 14 and contacts the third III-V compound layer 14. An insulating layer 22 is disposed between the drain electrode 18 and the gate electrode 20, wherein the insulating layer 22 covers the second III-V compound layer 12. The insulating layer 22 conformally covers the source electrode 16, the drain electrode 18, the gate electrode 20 and the second III-V compound layer 12. The insulating layer 22 serves as a passivation layer for the HEMT 100 to prevent the drain electrode 18, the gate electrode 20 and the source electrode 16 from being oxidized, and from dust and moisture. The insulating layer 22 includes aluminum nitride, silicon nitride or aluminum oxide. Furthermore, the insulating layer 22 can optionally include dopants which are positive ions such as boron ions.

Figure 2:
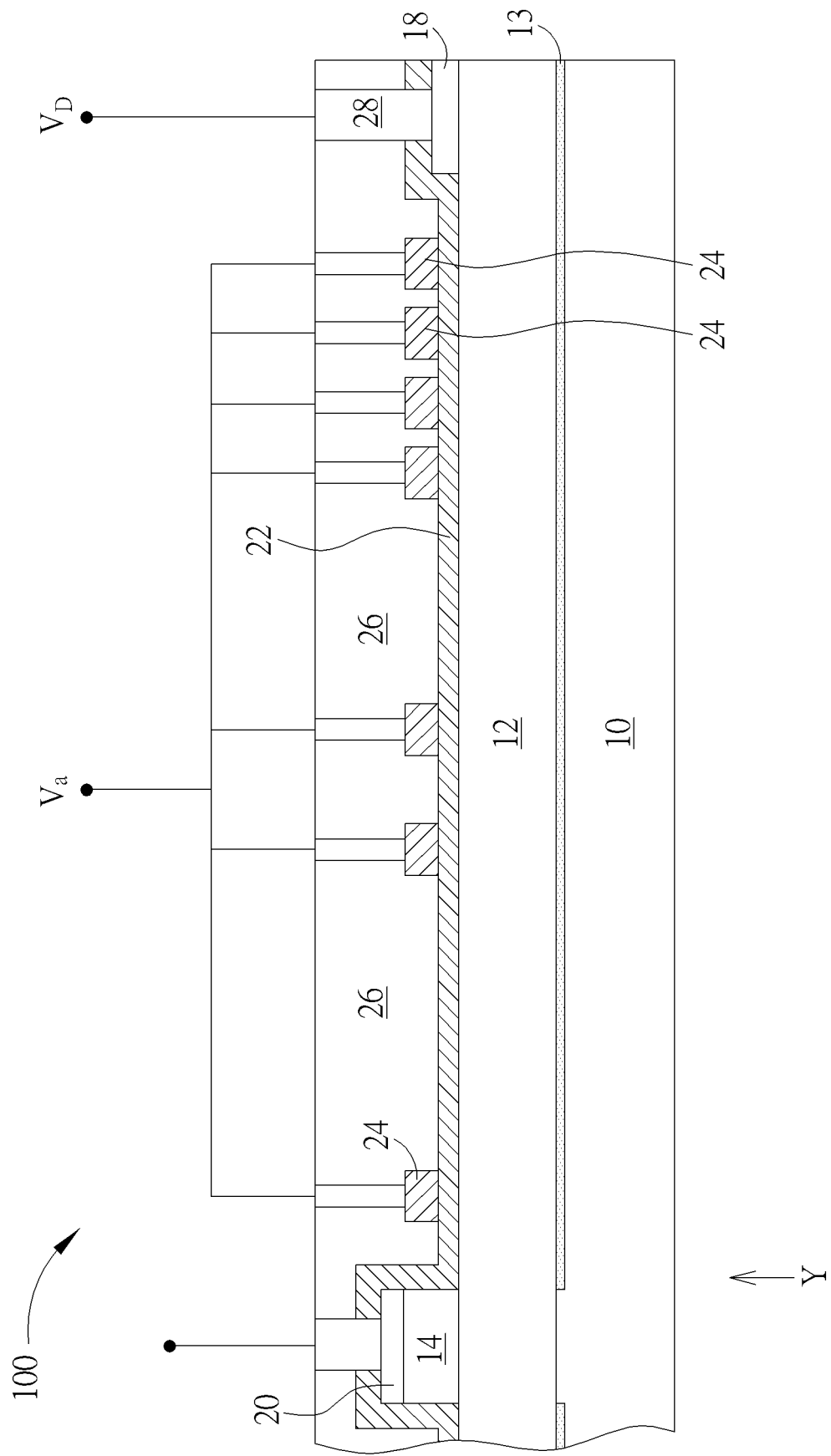
FIG. 2 depicts a modification of positions of electrodes.
Figure 3:
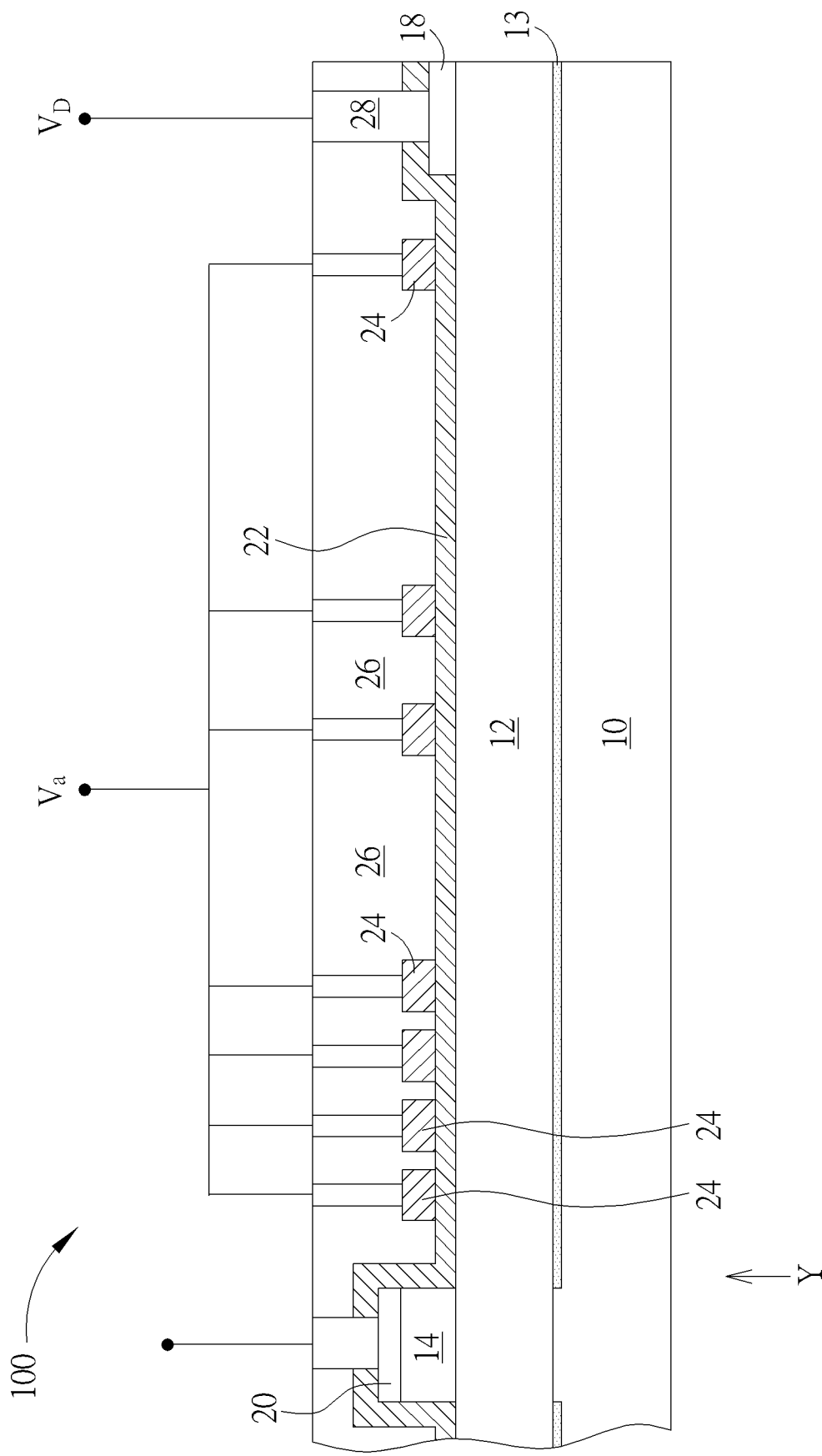
FIG. 3 depicts another modification of positions of electrodes.

At least one electrode 24 is disposed on the insulating layer 22 and contacts the insulating layer 22. A voltage $V_a$ is applied to the electrode 24. A drain voltage $V_D$ is applied to the drain electrode 18. The number of electrodes 24 is not limited. The embodiment of FIG. 1 takes the number of electrodes 24 as two, but this is merely an example. The electrode 24 is preferably disposed on the insulating layer 22 and closer to the drain electrode 18. In a different embodiment, the number of electrodes 24 can be more than two, more electrodes 24 are positioned closer to the drain electrode 18, and the distribution of the electrodes 24 decreases along the direction toward the gate electrode 20. For example, as shown in FIG. 2, the total number of the electrodes 24 is seven. There are four electrodes 24 closer to the drain electrode 18, two electrodes 24 at the middle of the drain electrode 18 and the gate electrode 20, and one electrode 24 at the position closer to the gate electrode 20. According to another preferred embodiment, there are fewer electrodes 24 closer to the drain electrode 18, and the distribution of the electrodes 24 increases along the direction toward the gate electrode 20. As shown in FIG. 3, the total number of electrodes 24 is seven. There are four electrodes 24 at the position closer to the gate electrode 20, two electrodes 24 at the middle of the drain electrode 18 and the gate electrode 20, and one electrode 24 at the position closer to the drain electrode 18. For the sake of clarity, the source electrode, and the structure between the source electrode and the gate electrode are omitted.

The drain electrode 18, the gate electrode 20, the source electrode 16 and the electrode 24 may respectively include metal conductive materials or other conductive materials. The metal conductive materials may be Au, W, Co, Ni, Ti, Mo, Cu, Al, Ta, Pd, Pt, the chemical compounds thereof, the composite layers thereof or alloys thereof. A vertical direction Y is perpendicular to a top surface of the second III-V compound layer 12, and the electrode 24 and the drain electrode 16 do not overlap each other along the vertical direction Y.

In addition, a dielectric layer 26 is disposed on the insulating layer 22. Numerous contact plugs 28 are disposed in the dielectric layer 26. Each of the contact plugs 28 respectively penetrates the dielectric layer 26 and the insulating layer 22. The contact plugs 28 respectively contact and electrically connect the drain electrode 18, the gate electrode 20, the source electrode 16 and the electrode 24.

Lattice defects often occur during the formation of the first III-V compound layer 10 and the second III-V compound layer 12, meaning, electrons are often trapped in the lattice defects when operating the devices. After the electrons are trapped, when the HEMT 100 is turned on, a sudden current drop (which is also called a current collapse) occurs. In order to solve the current collapse, the trapped electrons should be removed. Therefore, the electrode 24 is disposed on the insulating layer 22 and used to remove the trapped electrons. In detail, when the voltage $V_a$ is applied to the electrode 24, the trapped electrons are attracted to the bottom of the insulating layer 22. Electron holes are released from the insulating layer 22 to neutralize the trapped electrons. After the voltage $V_a$ is applied to the electrode 24, the trapped electrons can be removed or move to positions far away from the 2DEG 13. Because the HEMT 100 of the present invention is normally off, the steps of removing the trapped electrons are performed by applying voltages to the electrode 24 and the drain electrode 18 while the HEMT 100 is in the off state. After the trapped electrons are removed or moved and the HEMT 100 is turned on, the current of the 2DEG 13 will not be influenced by the trapped electrons. Therefore, the HEMT 100 can function well.

The voltage applied to the electrode 24 and the voltage applied to the drain electrode 18 can be the same or different.

In the first preferred embodiment, voltage $V_a$ is applied to the electrode 24, and drain voltage $V_D$ is applied to the drain electrode 18. The electrode 24 is disposed on the insulating layer 22; therefore, the insulating layer 22 needs to sustain the voltage applied to the electrode 24, i.e. the insulating layer 22 does not conduct when the voltage is applied to the electrode 24. Based on the different types and thickness of the insulating layer 22, the voltage range which the insulating layer 22 can sustain varies. For example, when the insulating layer 22 is silicon nitride and the thickness of the insulating layer 22 is between 100 and 1000 nanometers, the voltage range that the insulating layer 22 can sustain is between 108 and 1080 volts. When the insulating layer 22 is aluminum oxide and the thickness of the insulating layer 22 is between 100 and 1000 nanometers, the voltage range that the insulating layer 22 can sustain is between 100 and 1000 volts. When the insulating layer 22 is aluminum nitride and the thickness of the insulating layer 22 is between 100 and 1000 nanometers, the voltage range that the insulating layer 22 can sustain is between 117 and 1170 volts.

Figure 4:
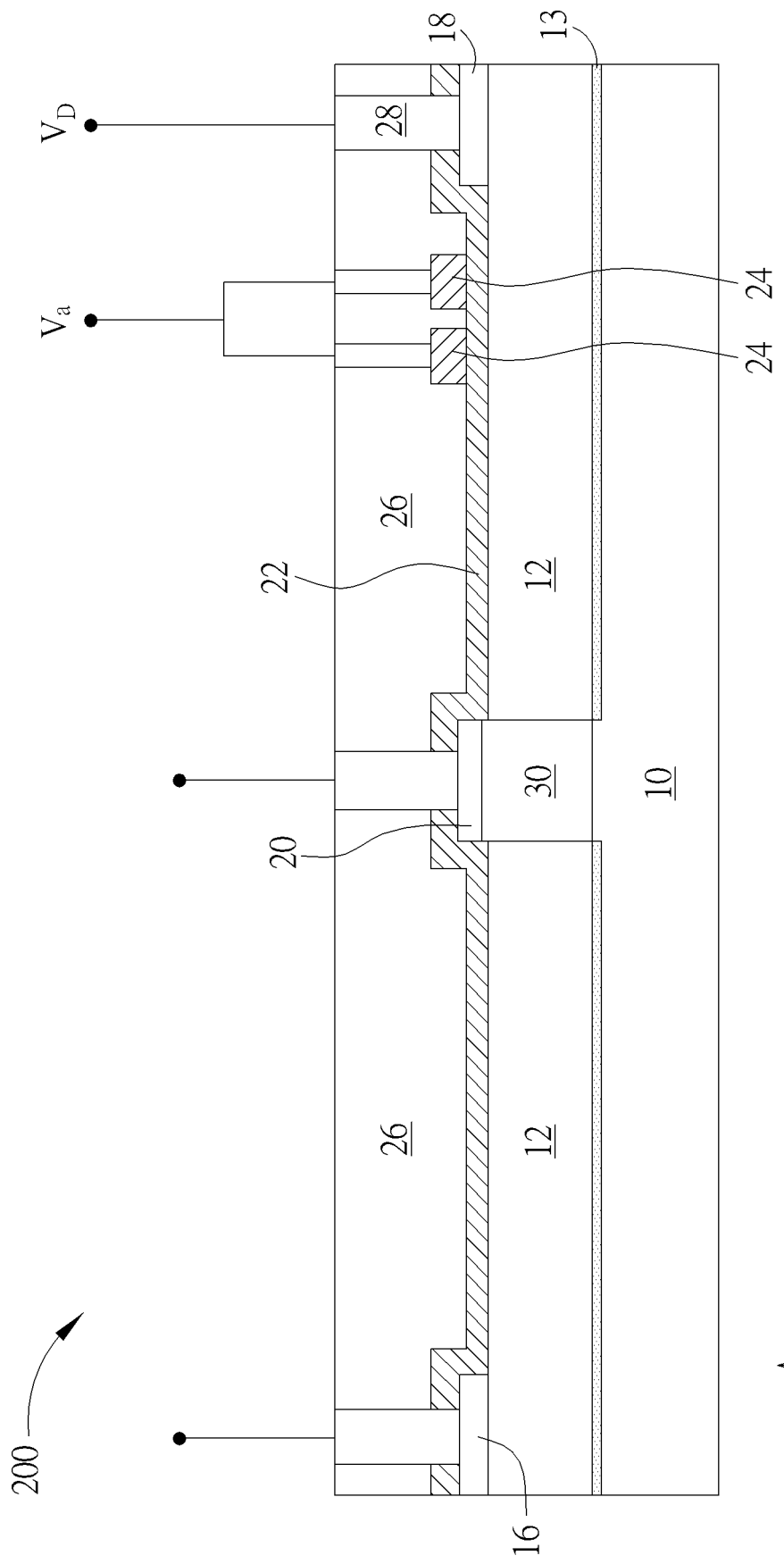
FIG. 4 depicts an HEMT according to a second preferred embodiment of the present invention.

FIG. 4 depicts an HEMT according to a second preferred embodiment of the present invention, wherein elements which are substantially the same as those in the first preferred embodiment are denoted by the same reference numerals; an accompanying explanation is therefore omitted.

Figure 14:
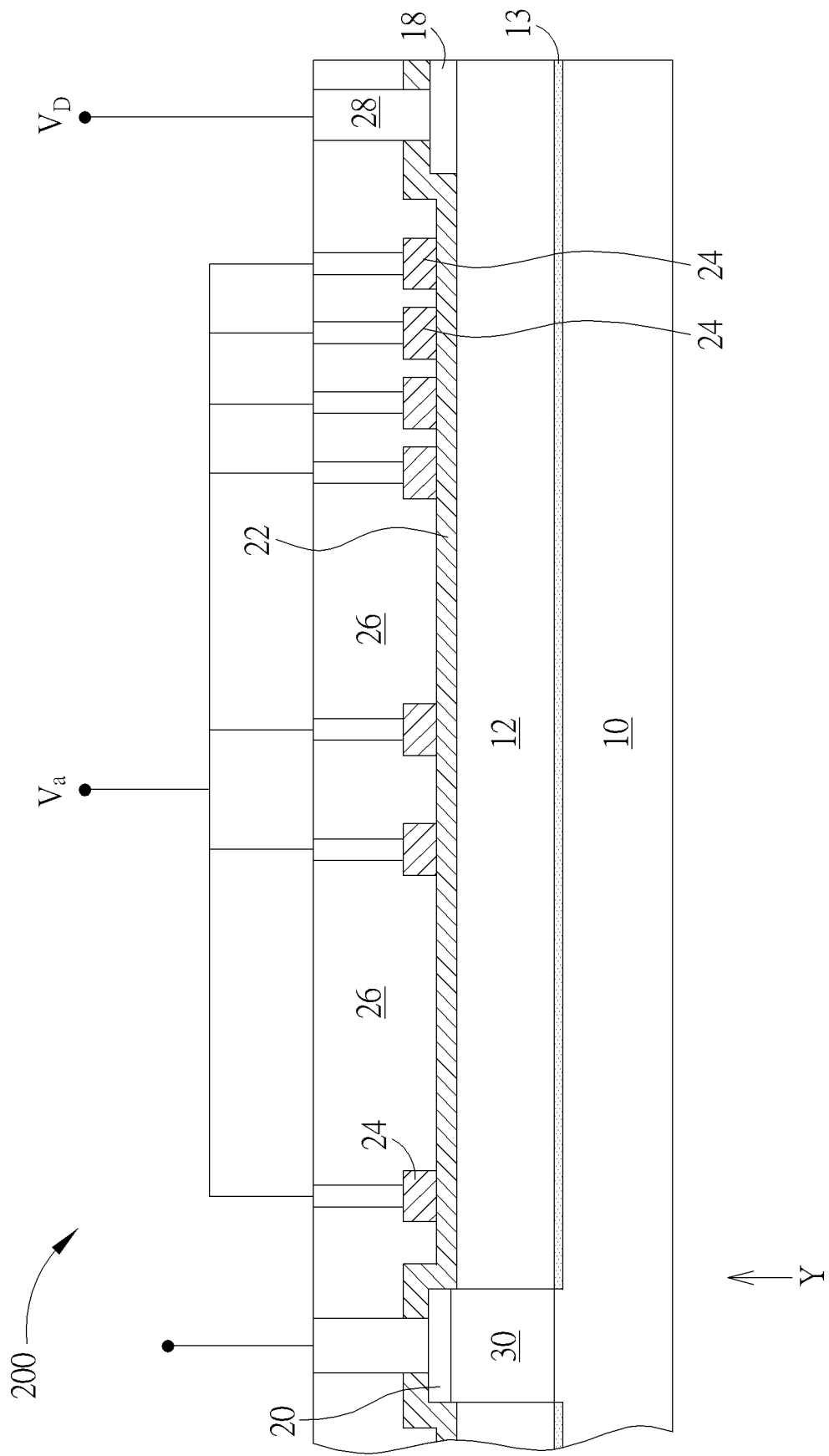
FIG. 14 depicts a modification of positions of electrodes according to a second preferred embodiment of the present invention.
Figure 15:
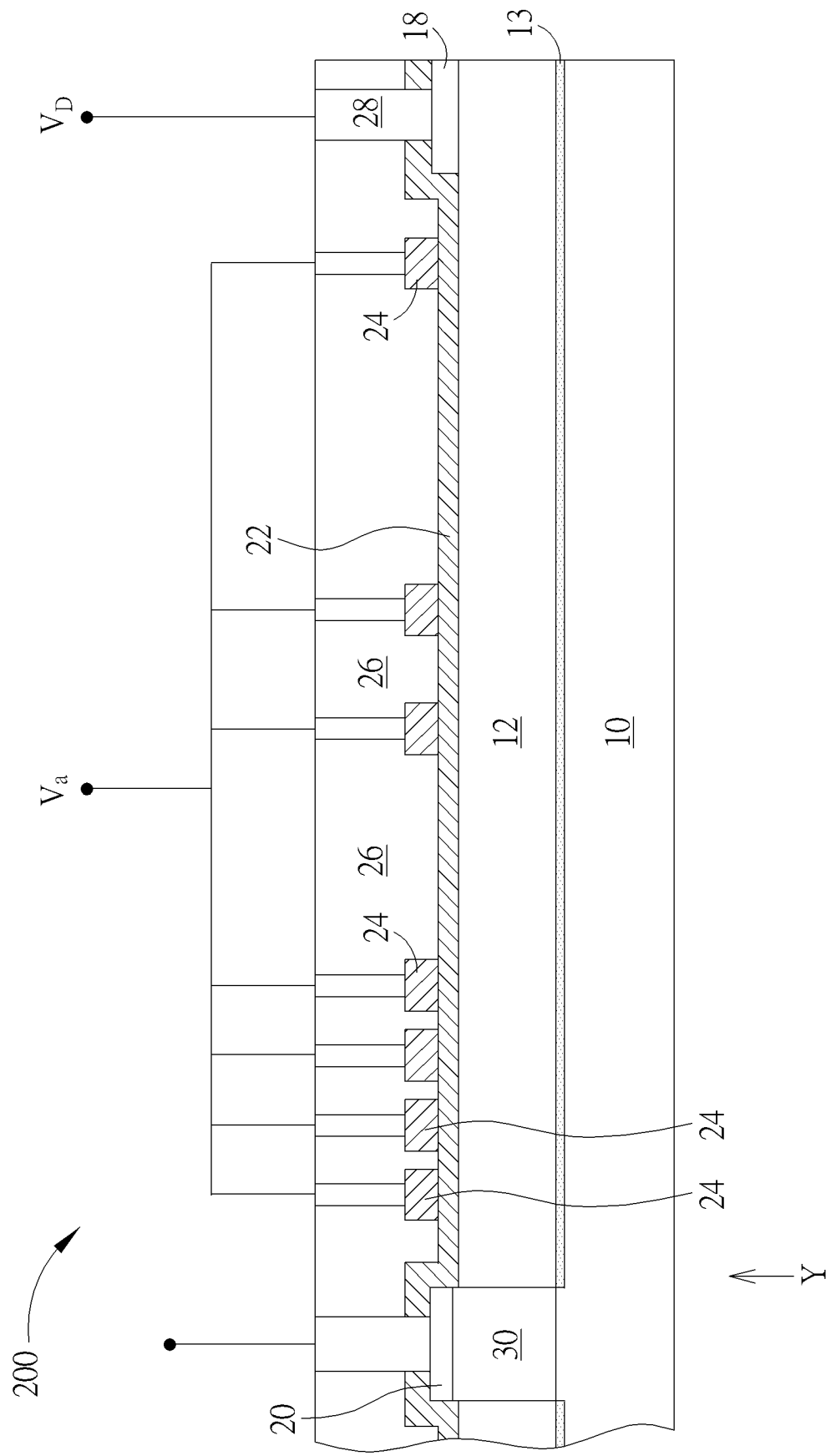
FIG. 15 depicts another modification of positions of electrodes according to a second preferred embodiment of the present invention.

As shown in FIG. 4, the HEMTs in the first preferred embodiment and the second preferred embodiment are both normally-off transistors. The difference between the first preferred embodiment and the second preferred embodiment is that the HEMT 100 utilizes the third III-V compound layer 14 under the gate electrode 20 to reach the normally-off state. An HEMT 200 utilizes the fluorine-containing region 30 in the second III-V compound layer 12 directly under the gate electrode 20 to reach the normally-off state. Similar to the HEMT 100 in FIG. 2, as shown in FIG. 14, the distribution of the electrodes 24 of the HEMT 200 can decrease along the direction toward the gate electrode 20 as well. Moreover, similar to the HEMT 100 in FIG. 3, as shown in the HEMT 200 in FIG. 15, the distribution of the electrodes 24 increases along the direction toward the gate electrode 20.

Figure 5:
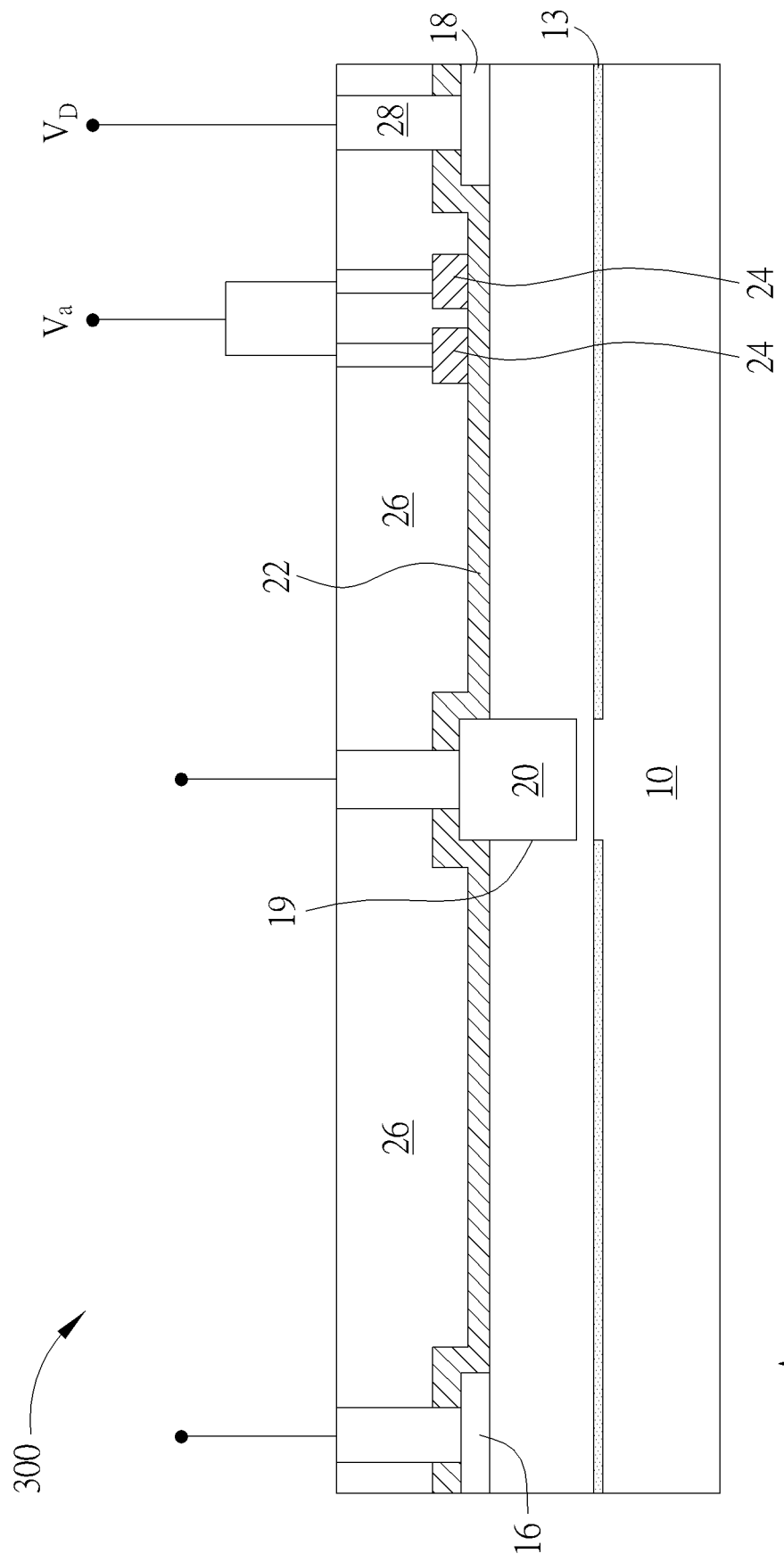
FIG. 5 depicts an HEMT according to a third preferred embodiment of the present invention.

FIG. 5 depicts an HEMT according to a third preferred embodiment of the present invention, wherein elements which are substantially the same as those in the first preferred embodiment are denoted by the same reference numerals; an accompanying explanation is therefore omitted.

As shown in FIG. 5, the HEMTs in the first preferred embodiment and the second preferred embodiment are both normally-off transistors. Compared with the first preferred embodiment, an HEMT 300 reaches the normally-off state by filling the gate electrode 20 into a recess 19 in the second III-V compound layer 12.

Figure 6:
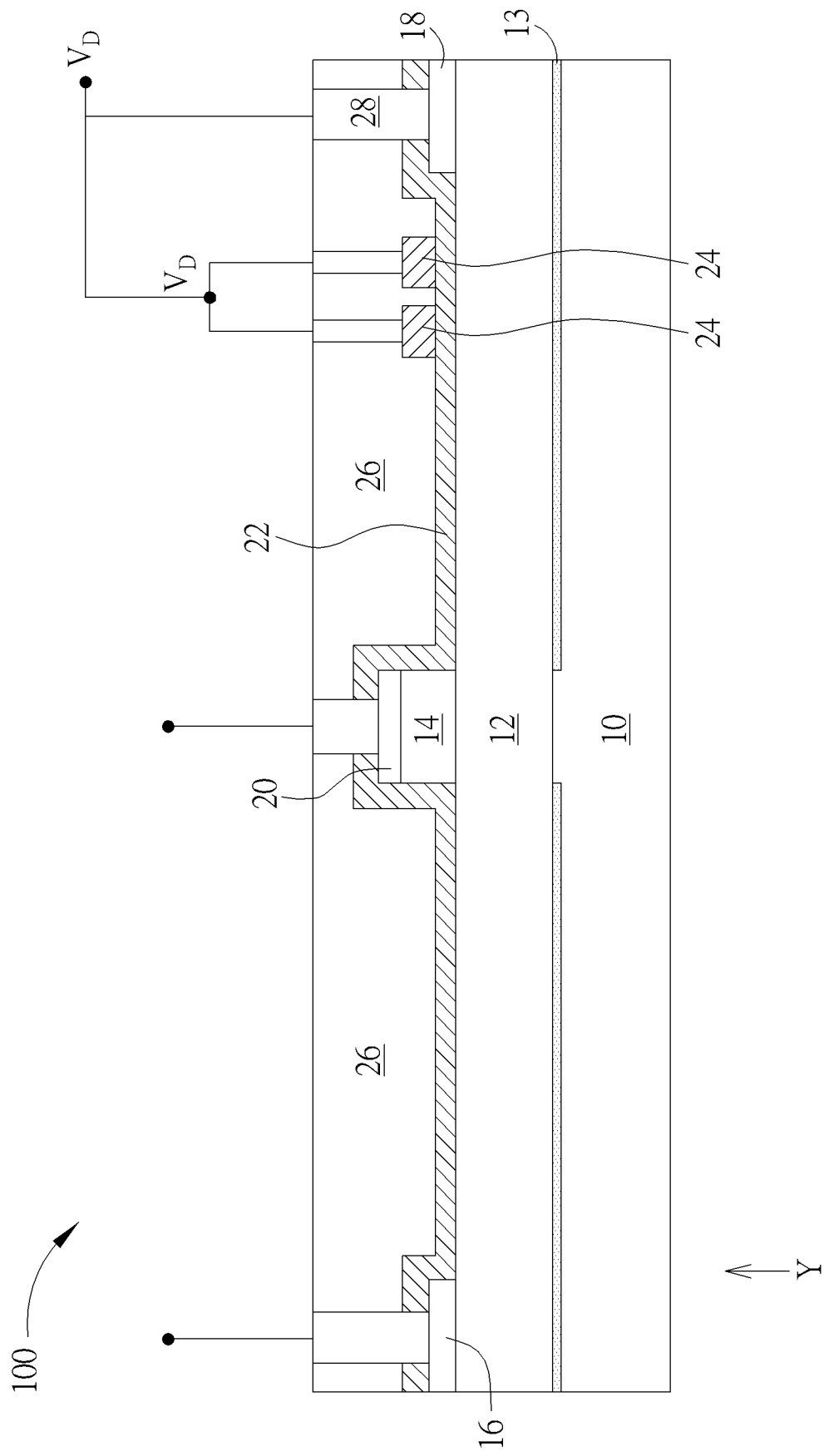
FIG. 6 depicts a modification of a method of applying voltages to an electrode and a drain electrode.
Figure 7:
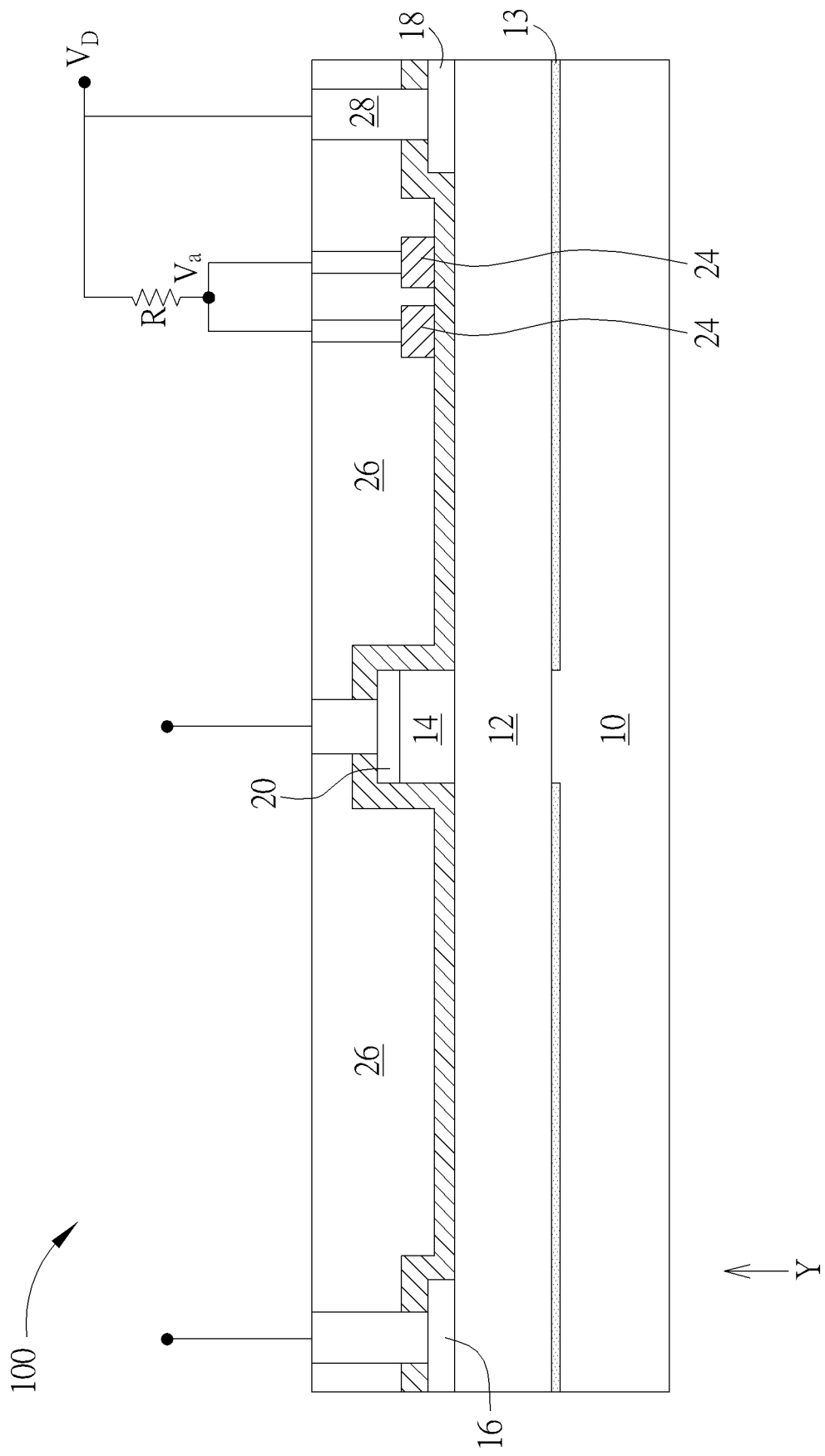
FIG. 7 depicts another modification of a method of applying voltages to an electrode and a drain electrode.

FIG. 6 to FIG. 7 depict modifications of a method to apply voltages to an electrode and a drain electrode, wherein elements which are substantially the same as those in the first preferred embodiment are denoted by the same reference numerals; an accompanying explanation is therefore omitted.

Although the HEMTs in FIG. 6 and FIG. 7 are the same as those in the first preferred embodiment, the HEMTs illustrated in the second preferred embodiment and the third preferred embodiment can also use the same methods in FIG. 6 and FIG. 7.

As shown in FIG. 6, the electrode 24 and the drain electrode 18 are electrically connected and are simultaneously switched on and off, so that the drain voltage $V_D$ is applied to the electrode 24. In another case, as shown in FIG. 7, because the HEMT 100 is often operated under a high voltage, when the drain voltage $V_D$ is higher than the voltage that the insulating layer 22 can sustain, a resistor R can be coupled to the electrode 24 in series before the drain voltage $V_D$ is applied to the electrode 24. In this way, the resistor R can lower the drain voltage $V_D$ to make the voltage $V_a$ smaller than the drain voltage $V_D$, allowing the voltage $V_a$ to be within the range that the insulating layer 22 can sustain.

Figure 16:
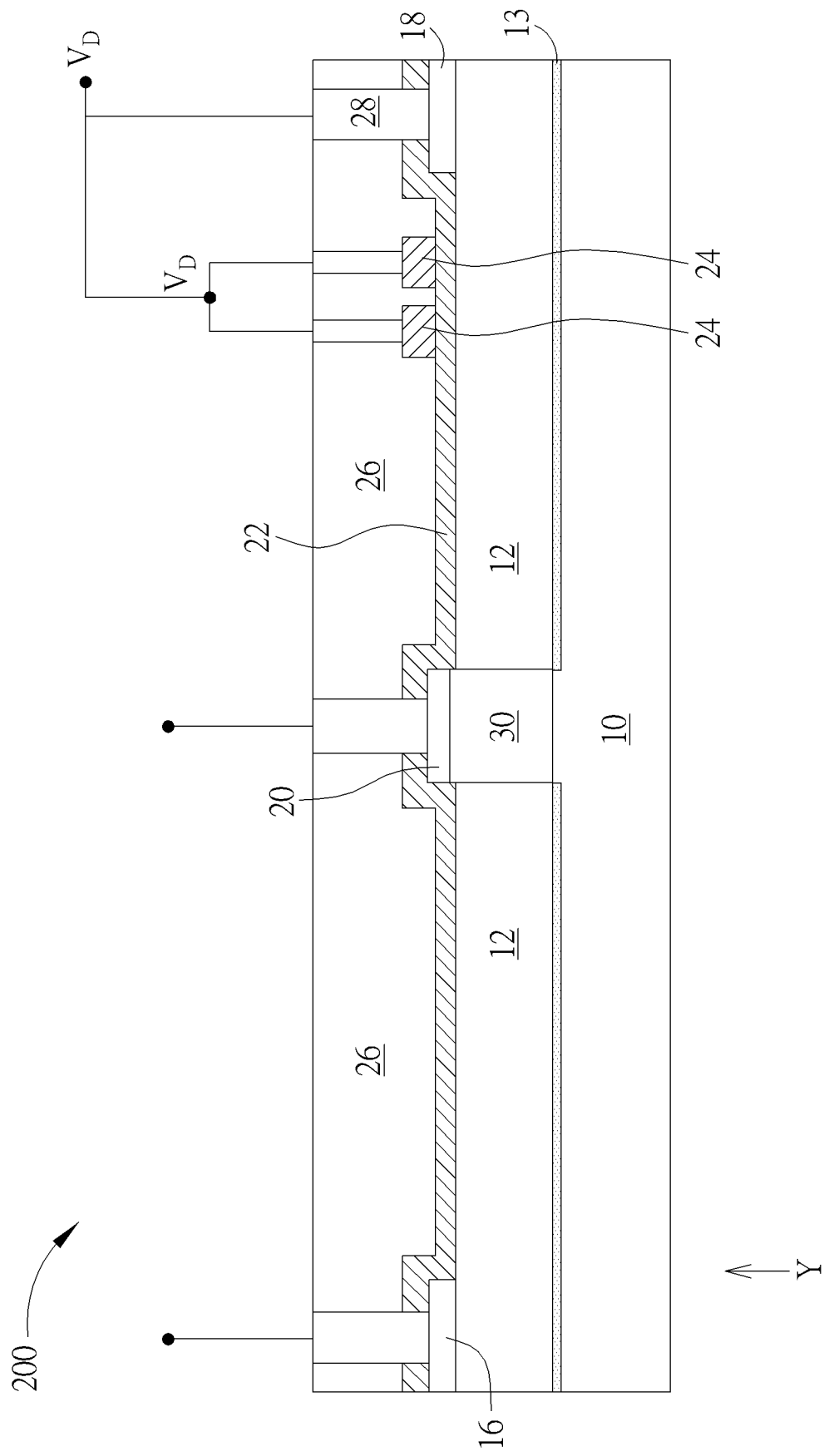
FIG. 16 depicts a modification of a method of applying voltages to an electrode and a drain electrode according to a second preferred embodiment of the present invention.

As shown in FIG. 16, the HEMT 200 can also be operated in a similar way to the HEMT 100. In details, the electrode 24 and the drain electrode 18 are electrically connected and are simultaneously switched on and off, so that the drain voltage $V_D$ is applied to the electrode 24.

FIG. 8 to FIG. 13 depict a method of fabricating an HEMT according to a fourth preferred embodiment of the present invention, wherein elements which are substantially the same as those in the first preferred embodiment are denoted by the same reference numerals; an accompanying explanation is therefore omitted. FIGS. 8 to 13 depict a method of fabricating the HEMT illustrated in the first preferred embodiment; however, the HEMTs in the second preferred embodiment and the third preferred embodiment can use the similar method by amending the steps in FIG. 9 and FIG. 10.

Figure 8:
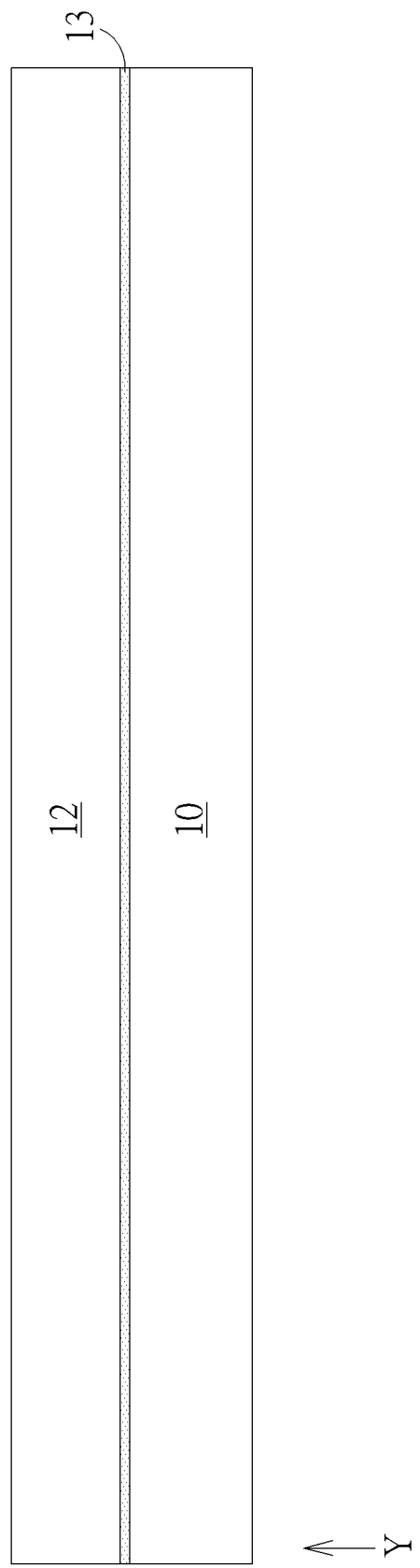
Figure 9:
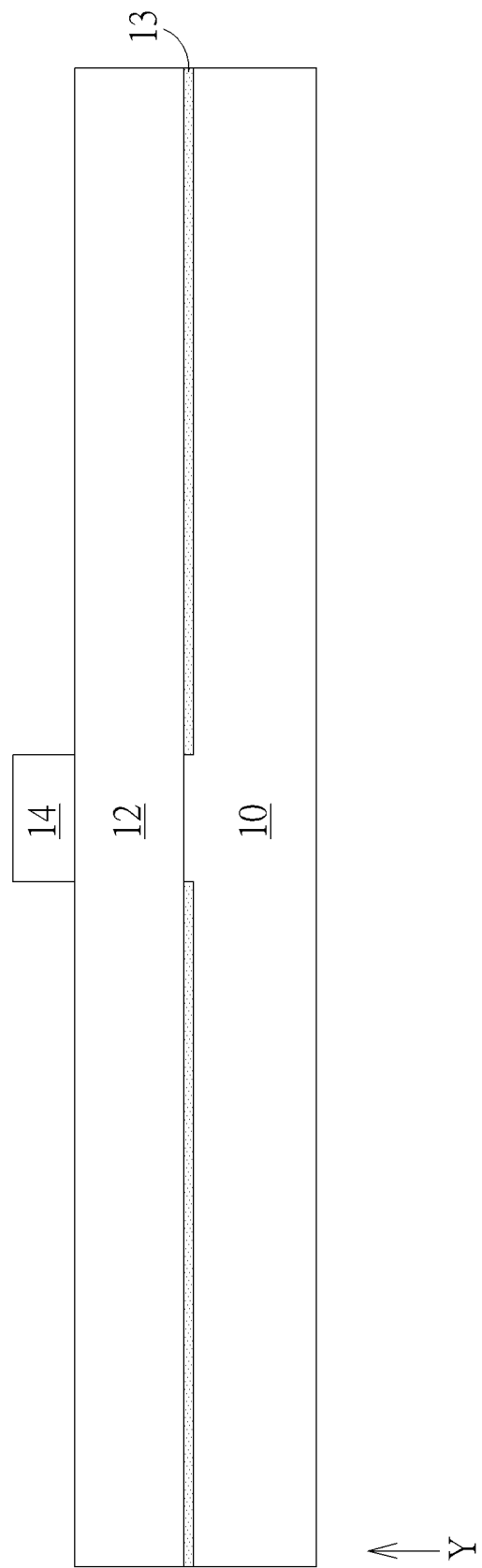

As shown in FIG. 8, a first III-V compound layer 10 is provided. A second III-V compound layer 12 is formed on the first III-V compound layer 10. The composition of the first III-V compound layer 10 and the second III-V compound layer 12 are different from each other. A 2DEG is generated in the second III-V compound layer 12. As shown in FIG. 9, a third III-V compound layer 14 is formed on the second III-V compound layer 12. At this point, the 2DEG is interrupted, and the HEMT formed afterward will become a normally-off transistor. An HEMT of the second preferred embodiment can be formed by replacing the step of forming the third III-V compound layer 14 with a step of forming a fluorine-containing region (not shown in FIG. 9). The method of forming the fluorine-containing region includes implanting fluorine ions into the second III-V compound layer 12. Additionally, an HEMT of the third preferred embodiment can be formed by replacing the step of forming the third III-V compound layer 14 with a step of forming a recess (not shown in FIG. 9) in the second III-V compound layer 12. The method of forming the recess includes etching (but not penetrating) the second III-V compound layer 12.

Figure 10:
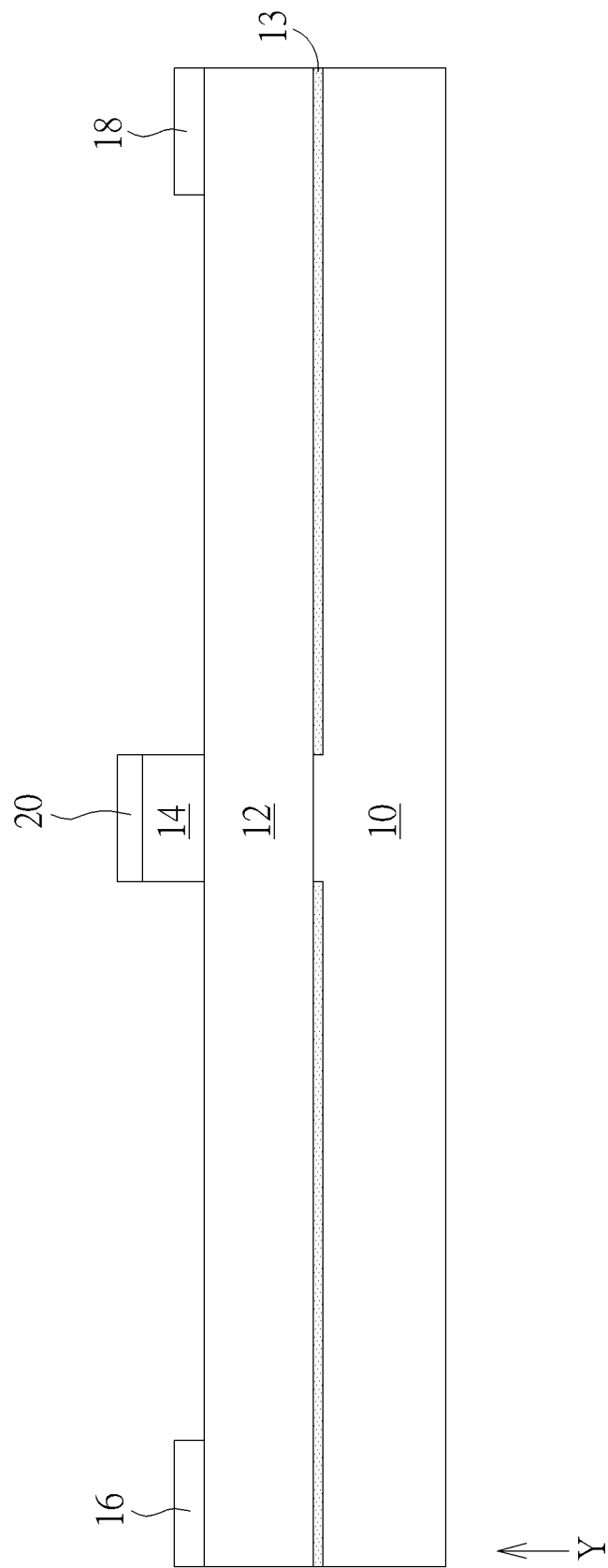

As shown in FIG. 10, a source electrode 16, a drain electrode 18 and a gate electrode 20 are formed on the second III-V compound layer 12. The gate electrode 20 is between the source electrode 16 and the drain electrode 18. The gate electrode 20 contacts the third III-V compound layer 14. The source electrode 16 and the drain electrode 18 contact the second III-V compound layer 12. The HEMT of the second preferred embodiment can be formed by forming the gate electrode 20 to contact the fluorine-containing region. The HEMT of the third preferred embodiment can be formed by forming the gate electrode 20 in the recess.

Figure 11:
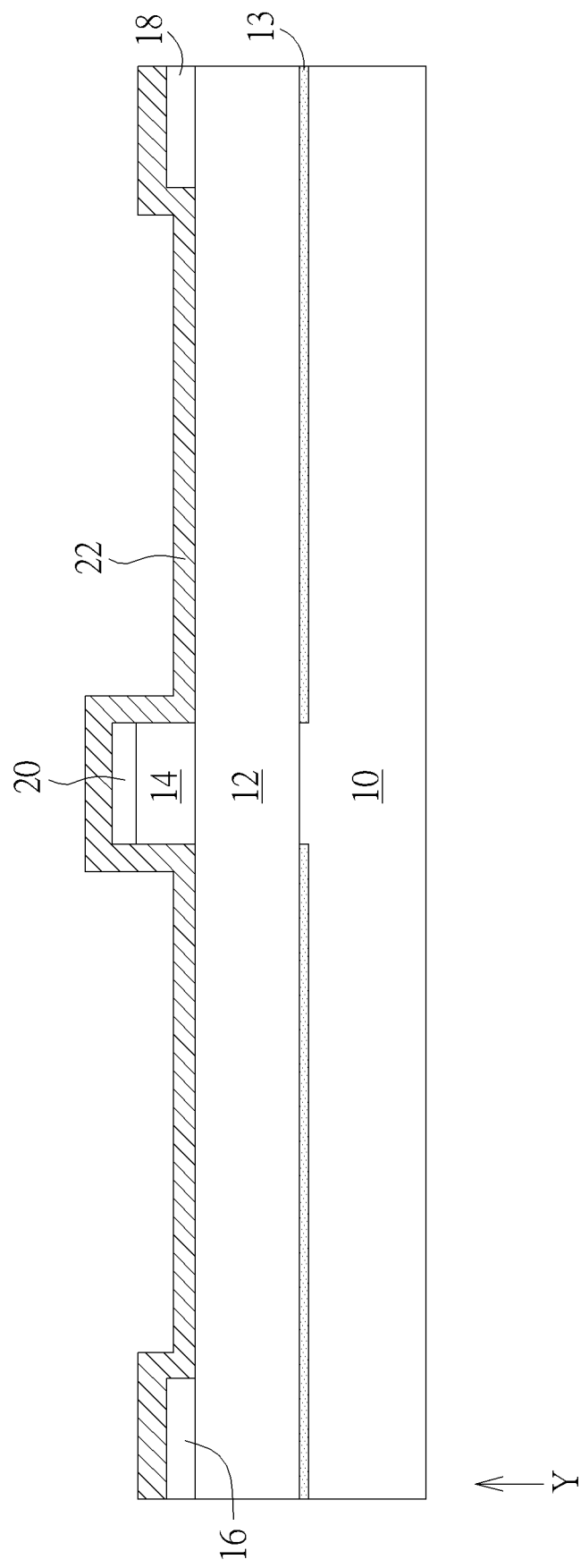
Figure 12:
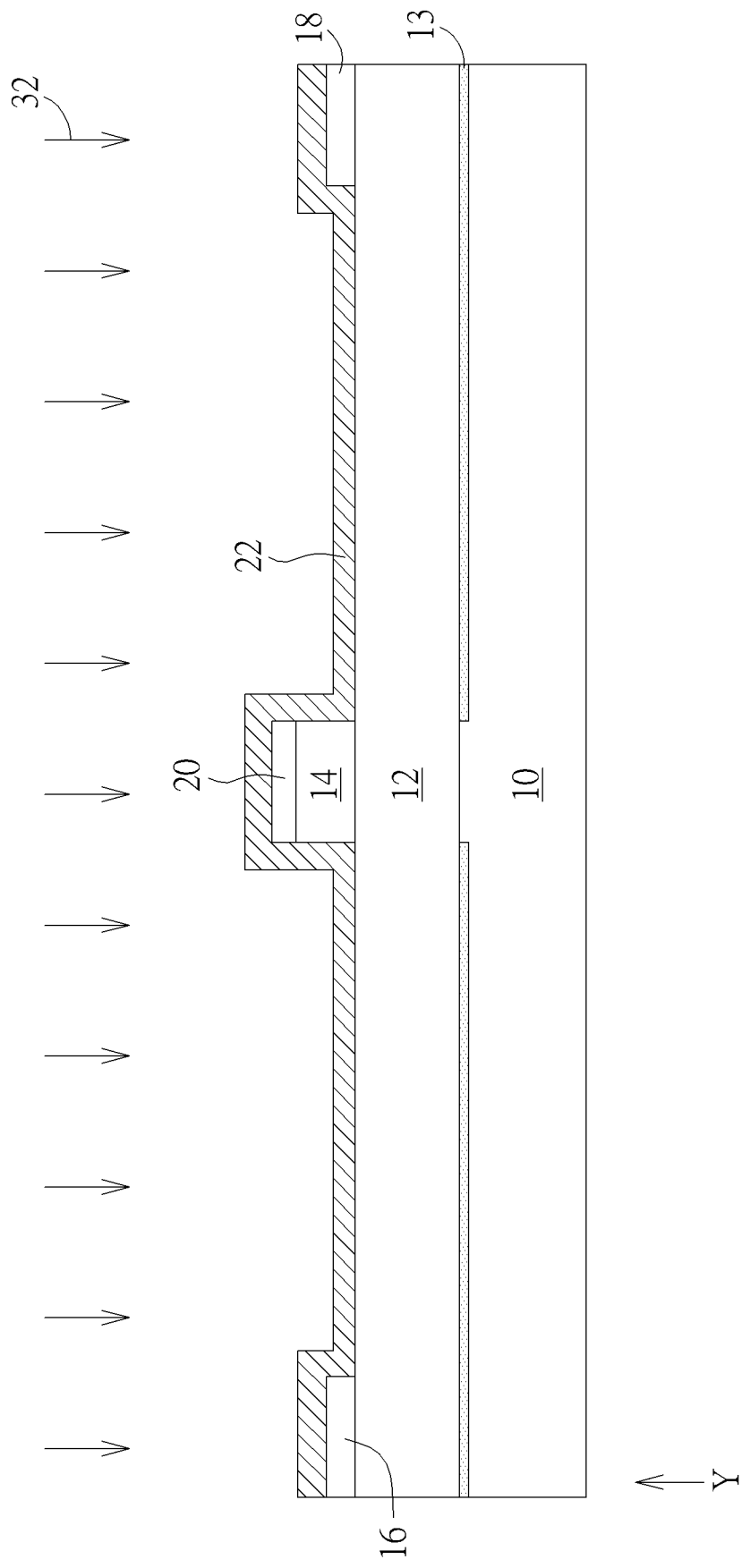
Figure 13:
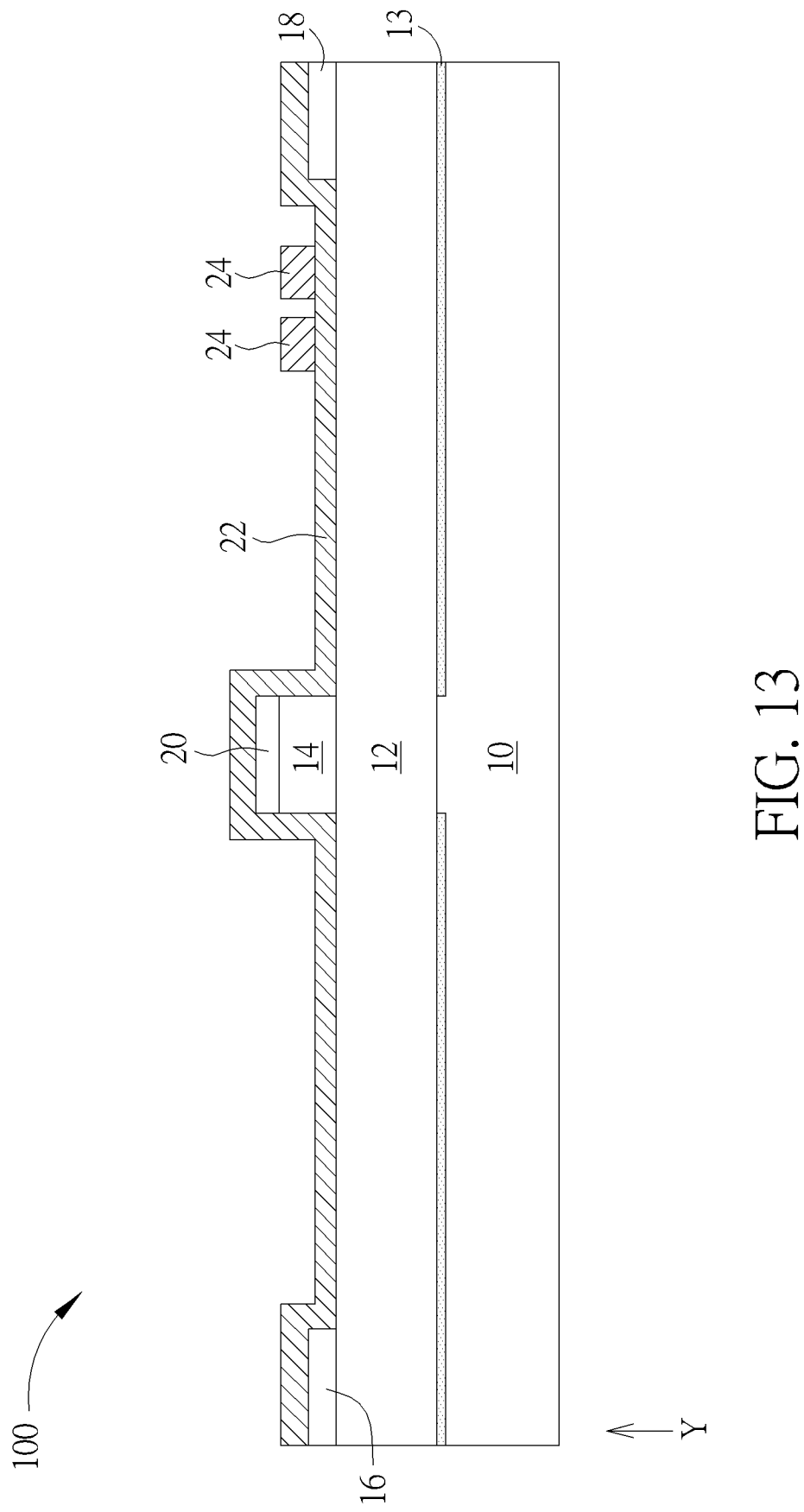

As shown in FIG. 11, an insulating layer 22 is formed to conformally cover the second III-V compound layer 12, the drain electrode 18, the source electrode 16 and the gate electrode 20. As shown in FIG. 12, after the insulating layer 22 is formed, a positive ion implantation 32 can be performed. For example, boron ions can be implanted. As shown in FIG. 13, after forming the insulating layer 22, at least one electrode is formed on the insulating layer 22 between the drain electrode 18 and the gate electrode 20.

The electrode 24 contacts the insulating layer 22. The electrode 24 is preferably closer to the drain electrode 18 and farther from the gate electrode 20. A vertical direction Y is perpendicular to the top surface of the second III-V compound layer 12. The electrode 24 and the drain electrode 18 do not overlap along the vertical direction. At this point, the HEMT 100 of the present invention is completed.

Next, as shown in FIG. 1, a dielectric layer 26 is formed to entirely cover the insulting layer 22. Later, numerous contact plugs 28 penetrate the dielectric layer 26 and the insulating layer 22. Contact plugs 28 respectively contact the electrode 24, the drain electrode 18, the source 16 and the gate electrode 20. Subsequently, metal interconnections are formed to couple the electrode 24 to the voltage V a and couple the drain electrode 18 to the drain voltage $V_D$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a first III-V compound layer;
   a second III-V compound layer disposed on the first III-V compound layer, wherein a composition of the first III-V compound layer and a composition of the second III-V compound layer are different from each other;
   a source electrode and a drain electrode disposed on the second III-V compound layer;
   a gate electrode disposed on the second III-V compound layer between the source electrode and the drain electrode;
   a fluorine-containing region disposed within the second III-V compound layer and under the gate electrode, wherein the gate electrode covers the fluorine-containing region;
   an insulating layer disposed between the drain electrode and the gate electrode and covering the second III-V compound layer; and
   a plurality of electrodes disposed on the insulating layer and contacting the insulating layer, wherein the plurality of electrodes are positioned between the gate electrode and the drain electrode and a distribution of the plurality of electrodes decreases along a direction toward the gate electrode.

2. The HEMT of claim 1, wherein the plurality of electrodes are electrically connected to the drain electrode.

3. The HEMT of claim 1, wherein a voltage is applied to the plurality of electrodes, a drain voltage is applied to the drain electrode, and the voltage is different from the drain voltage.

4. The HEMT of claim 1, wherein a resistor couples to each of the plurality of electrodes in series, and a drain voltage is applied to the drain electrode and the resistor.

5. The HEMT of claim 1, wherein the insulating layer conformally covers the source electrode, the drain electrode and the gate electrode.

6. The HEMT of claim 1, wherein the plurality of electrodes are electrically connect to each other, a voltage is applied to the plurality of electrodes, the insulating layer is silicon nitride, a thickness of the insulating layer is between 100 and 1000 nanometers and the voltage is between 108 and 1080 volts.

7. The HEMT of claim 1, wherein the plurality of electrodes are electrically connect to each other, a voltage is applied to the plurality of electrodes, the insulating layer is aluminum oxide, a thickness of the insulating layer is between 100 and 1000 nanometers and the voltage is between 100 and 1000 volts.

8. The HEMT of claim 1, wherein the plurality of electrodes are electrically connect to each other, a voltage is applied to the plurality of electrodes, the insulating layer is aluminum nitride, a thickness of the insulating layer is between 100 and 1000 nanometers and the voltage is between 117 and 1170 volts.

9. The HEMT of claim 1, wherein the first III-V compound layer is gallium nitride, and the second III-V compound layer comprises aluminum gallium nitride, indium aluminum nitride, aluminum indium gallium nitride or aluminum nitride.

10. A high electron mobility transistor (HEMT), comprising:
    a first III-V compound layer;
    a second III-V compound layer disposed on the first III-V compound layer, wherein a composition of the first III-V compound layer and a composition of the second III-V compound layer are different from each other;
    a source electrode and a drain electrode disposed on the second III-V compound layer;
    a gate electrode disposed on the second III-V compound layer between the source electrode and the drain electrode;
    a fluorine-containing region disposed within the second III-V compound layer, wherein the gate electrode covers the fluorine-containing region;
    an insulating layer disposed between the drain electrode and the gate electrode and covering the second III-V compound layer; and
    a plurality of electrodes disposed on the insulating layer and contacting the insulating layer, wherein the plurality of electrodes are positioned between the gate electrode and the drain electrode and a distribution of the plurality of electrodes increases along a direction toward the gate electrode.

11. The HEMT of claim 10, wherein the plurality of electrodes are electrically connected to the drain electrode.

12. The HEMT of claim 10, wherein a voltage is applied to the plurality of electrodes, a drain voltage is applied to the drain electrode, and the voltage is different from the drain voltage.

13. The HEMT of claim 10, wherein a resistor couples to each of the plurality of electrodes in series, and a drain voltage is applied to the drain electrode and the resistor.

14. The HEMT of claim 10, wherein the insulating layer conformally covers the source electrode, the drain electrode and the gate electrode.

15. A high electron mobility transistor (HEMT), comprising:
    a first III-V compound layer;
    a second III-V compound layer disposed on the first III-V compound layer, wherein a composition of the first III-V compound layer and a composition of the second III-V compound layer are different from each other;
    a source electrode and a drain electrode disposed on the second III-V compound layer;
    a gate electrode disposed on the second III-V compound layer between the source electrode and the drain electrode;
    a fluorine-containing region disposed within the second III-V compound layer, wherein the gate electrode covers the fluorine-containing region;

an insulating layer disposed between the drain electrode and the gate electrode and covering the second III-V compound layer, wherein the insulating layer conformally covers the source electrode, the drain electrode and the gate electrode; and at least one electrode disposed on the insulating layer and contacting the insulating layer, wherein the drain electrode electrically connects to the electrode.

16. The HEMT of claim 15, wherein the drain electrode and the electrode are simultaneously switched on and off.

17. The HEMT of claim 15, wherein a resistor couples to the electrode in series, and a drain voltage is applied to the drain electrode and the resistor.

18. The HEMT of claim 15, wherein the HEMT comprises a plurality of the electrodes, the plurality of the electrodes are disposed on the insulating layer and contact the insulating layer, the plurality of the electrodes are positioned between the gate electrode and the drain electrode and a distribution of the plurality of the electrodes increases along a direction toward the gate electrode.

19. The HEMT of claim 15, wherein the HEMT comprises a plurality of the electrodes, the plurality of the electrodes are disposed on the insulating layer, contact the insulating layer, and between the gate electrode and the drain electrode, and wherein a distribution of the plurality of the electrodes decreases along a direction toward the gate electrode.

* * * * *